(12) United States Patent
Jones et al.

(10) Patent No.: US 8,930,787 B1
(45) Date of Patent: Jan. 6, 2015

(54) DECODER IN A DEVICE RECEIVING DATA HAVING AN ERROR CORRECTION CODE AND A METHOD OF DECODING DATA

(75) Inventors: Ben J. Jones, Edinburgh (GB); William A. Wilkie, Eskbank (GB)

(73) Assignee: Xilinx, Inc., San Jose, CA (US)

( * ) Notice: Subject to any disclaimer, the term of this patent is extended or adjusted under 35 U.S.C. 154(b) by 103 days.

(21) Appl. No.: 13/308,726

(22) Filed: Dec. 1, 2011

(51) Int. Cl.
*H03M 13/00* (2006.01)

(52) U.S. Cl.
USPC .......................................................... 714/752

(58) Field of Classification Search
CPC .......... H03M 13/152; H03M 13/1555; H03M 13/158
USPC ................................ 714/752–758
See application file for complete search history.

(56) References Cited

U.S. PATENT DOCUMENTS

| | | | | |
|---|---|---|---|---|
| 4,888,778 | A * | 12/1989 | Brechard et al. | 714/755 |
| 5,130,990 | A * | 7/1992 | Hsu et al. | 714/784 |
| 5,875,199 | A * | 2/1999 | Luthi | 714/780 |
| 6,968,493 | B1 | 11/2005 | Weng | |
| 7,237,183 | B2 * | 6/2007 | Xin | 714/782 |
| 7,600,176 | B2 * | 10/2009 | Mead et al. | 714/784 |
| 7,793,200 | B1 | 9/2010 | Parekh et al. | |
| 8,397,144 | B1 * | 3/2013 | Norrie et al. | 714/785 |

OTHER PUBLICATIONS

U.S. Appl. No. 13/308,746, filed Dec. 1, 2011, Jones.
Francis, Michael, *Forward Error Correction on ITU-G.709 Networks using Reed-Solomon Solutions*, XAPP952 (v1.0), Dec. 5, 2007, pp. 1-14, Xilinx, Inc., San Jose, California, USA.
Gilardi, Gianluca et al. *Designing Convolutional Interleavers with Virtex Devices*, XAPP222 (v1.0), Sep. 27, 2000, pp. 1-6, Xilinx, Inc., San Jose, California, USA.

* cited by examiner

*Primary Examiner* — Steve Nguyen
(74) *Attorney, Agent, or Firm* — John J. King

(57) ABSTRACT

A decoder in a device receiving data having an error correction code is described. The decoder comprises a memory storing program code having instructions including control signals for decoding an error correction code; an address generator coupled to the memory, the address generator updating an address coupled to the memory for generating a next control signal; and a data processing circuit coupled to receive an instruction from the memory and further coupled to receive syndrome data, the data processing circuit generating error correction values. A method for decoding data having an error correction code is also disclosed.

17 Claims, 4 Drawing Sheets

DECODER IN A DEVICE RECEIVING DATA HAVING AN ERROR CORRECTION CODE AND A METHOD OF DECODING DATA

FIELD OF THE INVENTION

An embodiment relates generally to integrated circuit devices, and in particular to a decoder in a device receiving data having an error correction code and a method of decoding data having an error correction code.

BACKGROUND

The transmission of data is typically required in integrated circuits and electronic systems. However, for a variety of reasons, data may become corrupted during the transmission. While the accurate transmission of data is important in most systems, the transmission of corrupted data may significantly impact the performance of an integrated circuit. In some instances, corrupted data stored in the integrated circuit may render the integrated circuit unusable until the correct data is restored in the memory. Accordingly, steps are often taken to ensure that data is properly stored in a memory of an integrated circuit. For example, data may be read back to check for errors.

Error checking may include both error detection and error correction in the case of a single error, or error detection without error correction in the case of multiple errors. For example, forward error-correction is a type of signal processing that improves data reliability by introducing a known structure into a data sequence prior to transmission or storage of the data sequence. This known structure enables a receiving system to detect and possibly correct errors caused by corruption in the data transmission channel or the receiver. This coding technique enables the decoder to correct errors without requesting retransmission of the original information. However, techniques such as forward error correction may be difficult to implement efficiently and may result in significant limitations when implemented in an integrated circuit.

SUMMARY

A decoder in a device receiving data having an error correction code is described. The decoder comprises a memory storing program code having a plurality of instructions including control signals for decoding an error correction code; an address generator coupled to the memory, the address generator updating an address coupled to the memory for generating an instruction of the plurality of instructions; and a data processing circuit coupled to receive the instruction from the memory and further coupled to receive syndrome data, wherein the data processing circuit generates error correction values.

The decoder may further comprise an instruction register coupled to the memory, the instruction register storing an output of the memory. The address generator may comprise a program counter. The error correction values may include an error evaluator signal and/or an error locator signal. The decoder may further comprise a second data processing circuit coupled to the memory, where the second data processing circuit is coupled to receive the instruction and further coupled to receive second syndrome data. The second data processing circuit may generate second error correction values.

According to an alternate embodiment, a decoder in a device receiving data having an error correction code may comprise: a memory storing program code having a plurality of instructions including control signals for decoding an error correction code; a program counter coupled to the memory, the program counter updating an address coupled to the memory for generating an instruction of the plurality of instructions; a first data processing circuit coupled to receive the instruction from the memory and further coupled to receive first syndrome data, the first data processing circuit generating first error correction values; and a second data processing circuit coupled to receive the instruction from the memory and further coupled to receive second syndrome data, the second data processing circuit generating second error correction values.

The decoder may further comprise an instruction register coupled to the output of the memory, and one or more pipelining stages at the output of the instruction register. The first data processing circuit may generate a first error evaluator signal associated with the first syndrome data, and the second data processing circuit may generate a second error evaluator signal associated with the second syndrome data. The first data processing circuit may generate a first error locator associated with the first syndrome data, and the second data processing circuit may generate a second error locator associated with the second syndrome data. Each of the first and second data processing circuits may enable erasure decoding to designate known errors for input symbols. Each of the first and second data processing circuits may comprise Reed-Solomon decoders.

A method of decoding data having an error correction code is also described. The method comprises storing, in a memory, program code having instructions including control signals for decoding an error correction code; coupling an address to the memory; generating an instruction by accessing a predetermined memory location of the memory based upon the address; and generating error correction values based upon the instruction from the memory and further based upon syndrome data.

Generating an instruction by accessing a predetermined memory location of the memory based upon the address may comprise incrementing an address for the instruction using a program counter. Storing program code having instructions including control signals for decoding an error correction code may comprise downloading a configuration bitstream to an integrated circuit device having programmable resources. The method may further comprise coupling the control signal of the instruction to each of a plurality of data processing circuits. Generating error correction values based upon the instruction from the memory and further based upon syndrome data may comprise generating an error evaluator signal and/or an error locator signal.

DETAILED DESCRIPTION

Figure 1:
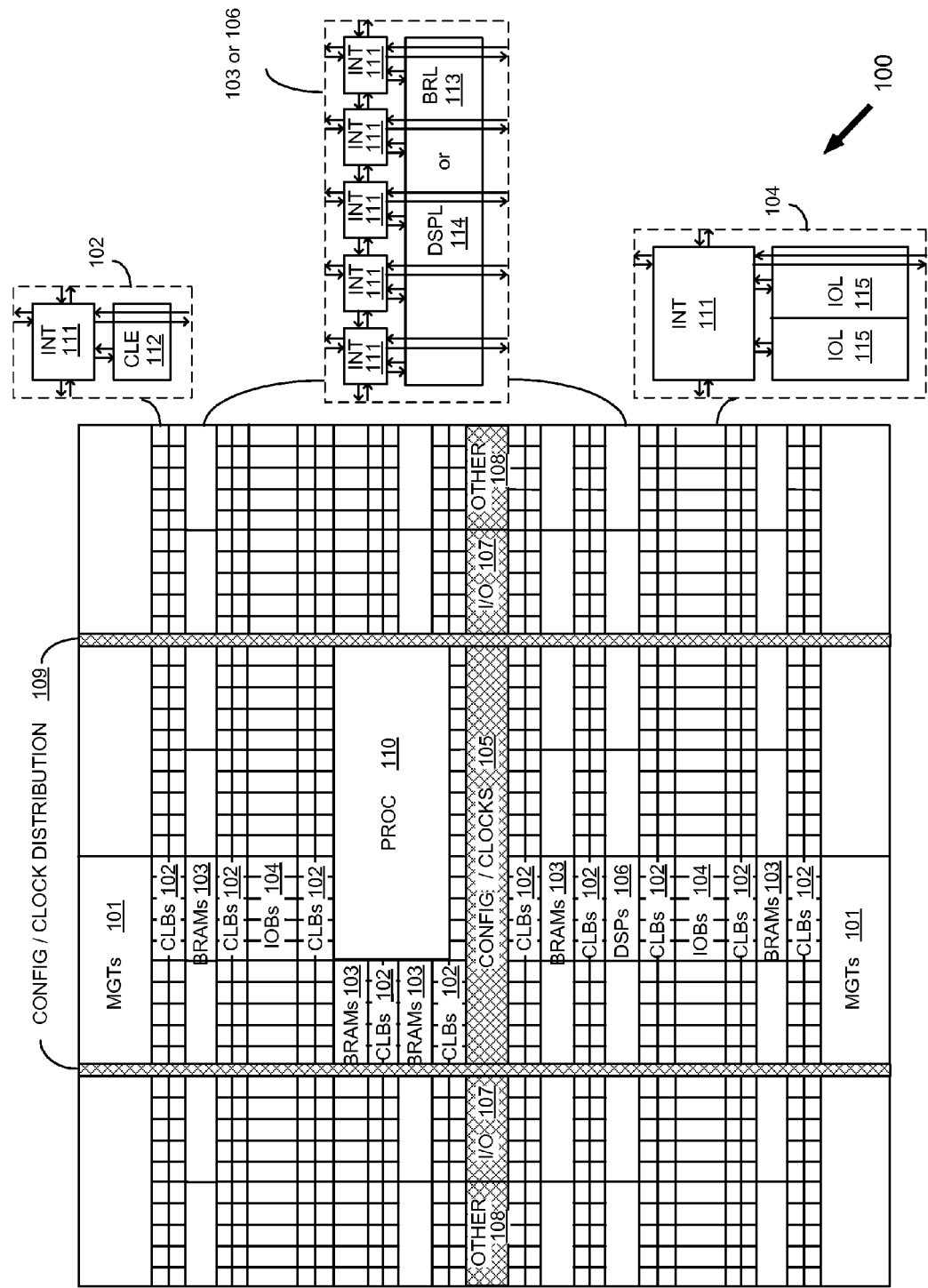
FIG. 1 is a block diagram of a programmable integrated circuit device having programmable resources according to an embodiment.

Turning first to FIG. 1, a block diagram of a programmable integrated circuit device having programmable resources is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., flash memory, as in some CPLDs), or in any other type of memory cell.

The device of FIG. 1 comprises an FPGA architecture 100 having a large number of different programmable tiles including multi-gigabit transceivers (MGTs) 101, CLBs 102, random access memory blocks (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g., configuration ports and clock ports), and other programmable logic 108 such as digital clock managers, analog-to-digital converters, system monitoring logic, and so forth. Some FPGAs also include dedicated processor blocks (PROC) 110, which may be used to implement a software application, for example.

In some FPGAs, each programmable tile includes a programmable interconnect element (INT) 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 may include a configurable logic element (CLE) 112 that may be programmed to implement user logic plus a single programmable interconnect element 111. A BRAM 103 may include a BRAM logic element (BRL) 113 in addition to one or more programmable interconnect elements. The BRAM includes dedicated memory separate from the distributed RAM of a configuration logic block. Typically, the number of interconnect elements included in a tile depends on the height of the tile. In the pictured embodiment, a BRAM tile has the same height as five CLBs, but other numbers may also be used. A DSP tile 106 may include a DSP logic element (DSPL) 114 in addition to an appropriate number of programmable interconnect elements. An IOB 104 may include, for example, two instances of an input/output logic element (IOL) 115 in addition to one instance of the programmable interconnect element 111. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die is used for configuration, clock, and other control logic. Horizontal areas 109 extending from this column are used to distribute the clocks and configuration signals across the breadth of the FPGA. Some FPGAs utilizing the architecture illustrated in FIG. 1 include additional logic blocks that disrupt the regular columnar structure making up a large part of the FPGA. The additional logic blocks may be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear in order to facilitate the efficient implementation of user logic.

One common implementation of a data transfer is the transfer of configuration data from a non-volatile memory to memory elements of the integrated circuit device, such as to configuration memory elements of a device having programmable resources. While the configuration data is typically provided to various circuits of the integrated circuit device, during a start-up operation other configuration data may be provided to the integrated circuit during a partial reconfiguration of the device. That is, rather than providing all of the configuration data to the integrated circuit device, new configuration data may be provided to the integrated circuit device to reprogram some of the circuits of the integrated circuit device. As programmable integrated circuits are implemented with more programmable circuits, the amount of time required to transfer the data to the programmable circuits is also increasing. Accordingly, any improvement in the amount of resources required to transfer configuration data or in the rate of transfer of the configuration data is beneficial.

Figure 2:
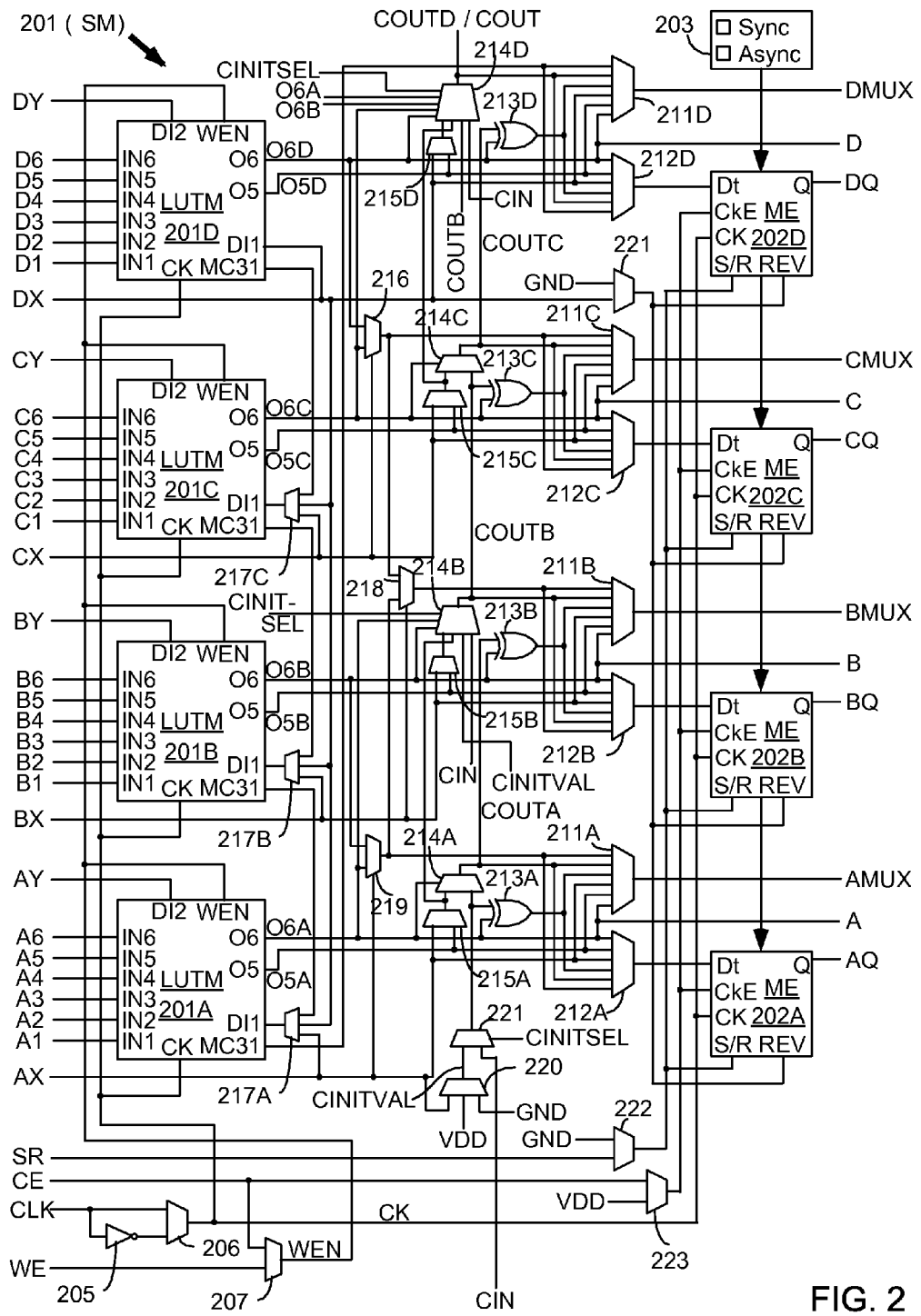
FIG. 2 is a block diagram of a configurable logic element according to an embodiment.

Turning now to FIG. 2, a block diagram of a configurable logic element is shown. In particular, FIG. 2 illustrates in simplified form a configurable logic element of a configuration logic block 102 of FIG. 1. In the embodiment of FIG. 2, slice M 201 includes four lookup tables (LUTMs) 201A-201D, each driven by six LUT data input terminals A1-A6, B1-B6, C1-C6, and D1-D6 and each providing two LUT output signals O5 and O6. The O6 output terminals from LUTs 201A-201D drive slice output terminals A-D, respectively. The LUT data input signals are supplied by the FPGA interconnect structure via input multiplexers, which may be implemented by programmable interconnect element 211, and the LUT output signals are also supplied to the interconnect structure. Slice M also includes: output select multiplexers 211A-211D driving output terminals AMUX-DMUX;

multiplexers 212A-212D driving the data input terminals of memory elements 202A-202D; combinational multiplexers 216, 218, and 219; bounce multiplexer circuits 222-223; a circuit represented by inverter 205 and multiplexer 206 (which together provide an optional inversion on the input clock path); and carry logic having multiplexers 214A-214D, 215A-215D, 220-221 and exclusive OR gates 213A-213D. All of these elements are coupled together as shown in FIG. 2. Where select inputs are not shown for the multiplexers illustrated in FIG. 2, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 2 for clarity, as well as from other selected figures herein.

In the pictured embodiment, each memory element 202A-202D may be programmed to function as a synchronous or asynchronous flip-flop or latch. The selection between synchronous and asynchronous functionality is made for all four memory elements in a slice by programming Sync/Asynch selection circuit 203. When a memory element is programmed so that the S/R (set/reset) input signal provides a set function, the REV input terminal provides the reset function. When the memory element is programmed so that the S/R input signal provides a reset function, the REV input terminal provides the set function. Memory elements 202A-202D are clocked by a clock signal CK, which may be provided by a global clock network or by the interconnect structure, for example. Such programmable memory elements are well known in the art of FPGA design. Each memory element 202A-202D provides a registered output signal AQ-DQ to the interconnect structure. Because each LUT 201A-201D provides two output signals, O5 and O6, the LUT may be configured to function as two 5-input LUTs with five shared input signals (IN1-IN5), or as one 6-input LUT having input signals IN1-IN6.

In the embodiment of FIG. 2, each LUTM 201A-201D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 217A-217C for LUTs 201A-201C), or to the two 32-bit RAMs via input terminals DI1 and DI2. RAM write operations in the LUT RAMs are controlled by clock signal CK from multiplexer 206 and by write enable signal WEN from multiplexer 207, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 201A may also be provided to the general interconnect structure for shift register chaining, via output select multiplexer 211D and CLE output terminal DMUX. Accordingly, the circuits and methods set forth below may be implemented in a device such as the device of FIGS. 1 and 2, or any other suitable device.

Figure 3:
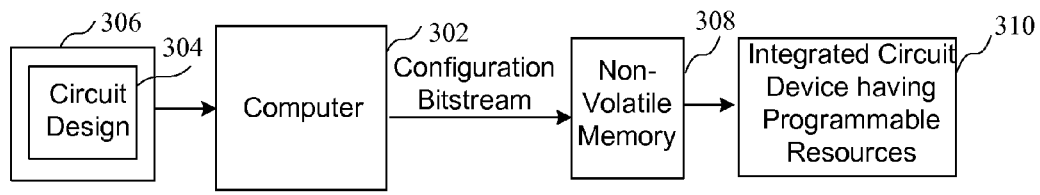
FIG. 3 is a block diagram of a system for programming a device having programmable resources according to an embodiment.

Turning now to FIG. 3, a block diagram of a system for programming a device having programmable resources is shown. In particular, a computer 302 is coupled to receive a circuit design 304 from a memory 306, and generate a configuration bitstream which is stored in the non-volatile memory 308. As will be described in more detail below, the circuit design may be a high level design, such as a circuit design defined in a hardware description language (HDL). Also, the computer may be configured to run software that generates a configuration bitstream which is stored in the non-volatile memory 308 and then provided to a device 310 having programmable resources. As will be described in more detail below, the device 310 may be any type of integrated circuit having programmable resources, such as a programmable logic device, or an application specific integrated circuit having programmable resources.

The software flow for a circuit design to be implemented in a programmable integrated circuit comprises synthesis, packing, placement and routing, as is well known in the art. Synthesis comprises the step of converting a circuit design in a high level design to a configuration of elements found in the programmable integrated circuit. For example, a synthesis tool operated by the computer 302 may implement the portions of a circuit design implementing certain functions in configurable logic blocks (CLBs) or digital signal processing (DSP) blocks, for example. An example of a synthesis tool is the ISE® tool available from Xilinx, Inc. of San Jose, Calif. Packing comprises the step of grouping portions of the circuit design into defined blocks of the device, such as CLBs. Placing comprises the step of determining the location of the blocks of the device defined during the packing step. Finally, routing comprises selecting paths of interconnect elements, such as programmable interconnects, in a programmable integrated circuit. At the end of place and route, all functions, positions and connections are known, and a configuration bitstream is then created. The bitstream may be created by a software module called BitGen available from Xilinx, Inc. of San Jose, Calif. The bitstream may also be encrypted according to a predetermined encryption standard. The bitstream is either downloaded by way of a cable or programmed into an EPROM for delivery to the programmable integrated circuit. If encoded, the bitstream is then decoded by the programmable integrated circuit according to the predetermined encryption standard.

To detect errors, parity bits are included within data. When data to be evaluated for errors is read back from a memory, check bits are generated based upon the data. The check bits of the data read back from memory should be zero if none of the bits including the data bits and the parity bits have been corrupted. The generated checkbits, called the syndrome, may also be used to determine the location of a bit error. The concatenation of data bits and the parity bits of a Hamming code, for example, may be described by an ordered set (d+p,d) where d is the width of the data and p is the width of the parity. The minimum number of check bits required for a single bit error correction is derived from the equation $d+p+1 \leq 2^p$.

Check bits may be generated from evaluating the "exclusive ORing" (XORing) of certain bits of a Hamming code which are read back from memory. That is, the check bits of a syndrome are generated based upon the data which is being evaluated for errors including the parity bits. If one or more bit errors is introduced in the stored data, several check bits show errors. The combination of these check bit errors enables determining the nature of the error. If all of the elements of the syndrome vector are zeros, no error is reported.

Any other non-zero result represents the bit error type and provides the location of any single bit errors to enable restoring the original data.

Another type of error correction code is a Reed-Solomon (RS) code. RS codes are linear block codes that can detect and correct burst errors. The n information symbols of a Reed-Solomon code word comprise k information symbols and n–k check symbols of s bits each. The RS decoder processes each block and attempts to correct errors and recover the original data. The decoder can correct up to t symbols that contain errors in the code word, where 2t=n–k. The number of errors detected can be used to indicate the status of a communication link. The most complex step in the decoding of a RS code is the key-equation solving step, which computes error evaluator and error locator polynomials from the syndromes of the received code word. This computation of polynomials uses finite-field arithmetic and requires multiple stages of computation with a non-rectangular structure, and may be achieved using the Berlekamp-Massey Algorithm (BMA), for example. A BMA decoder is used to determine an error locator polynomial, typically using a Chien search. That is, a received data stream will differ from a transmitted data stream by some error or syndromes. An error locator polynomial representing the errors is generated. While these computations may be implemented in control logic, such as counters, comparators, and finite state machines implemented in LUT resources in an FPGA, for example, this control logic would contribute significantly to the size and critical path of the decoder circuit. Furthermore, such logic circuits tend to be tightly coupled to the data processing circuits, and are thus difficult to share between multiple data processing circuits.

According to various embodiments set forth below, the generation of control signals for the data processing circuits is enabled with the use of a ROM containing a small program (microcode) which generates the control signals necessary to implement a data processing circuit, such as a BMA datapath circuit of an RS decoder, in order to implement a decoder. That is, rather than generating control signals using control logic, control signals necessary to implement a data processing circuit are generated by a program ROM. The ROM can be indexed by a small binary counter or a linear feedback shift register (LFSR), the advance of which is controlled by a small number of hand shaking signals to ensure that the circuit starts and stops operation at the appropriate times. Alternatively, the program counter may be a gray code counter, for example. According to one embodiment, the program ROM can be implemented using a single BRAM resource in the FPGA. In some cases, a LUT-based ROM, rather than a BRAM-based ROM, might be appropriate for implementing an instruction generator, as will be described in more detail below. For example, a LUT-based ROM of a CLE described in FIG. 2 could be used instead of a BRAM of FIG. 1.

Figure 4:
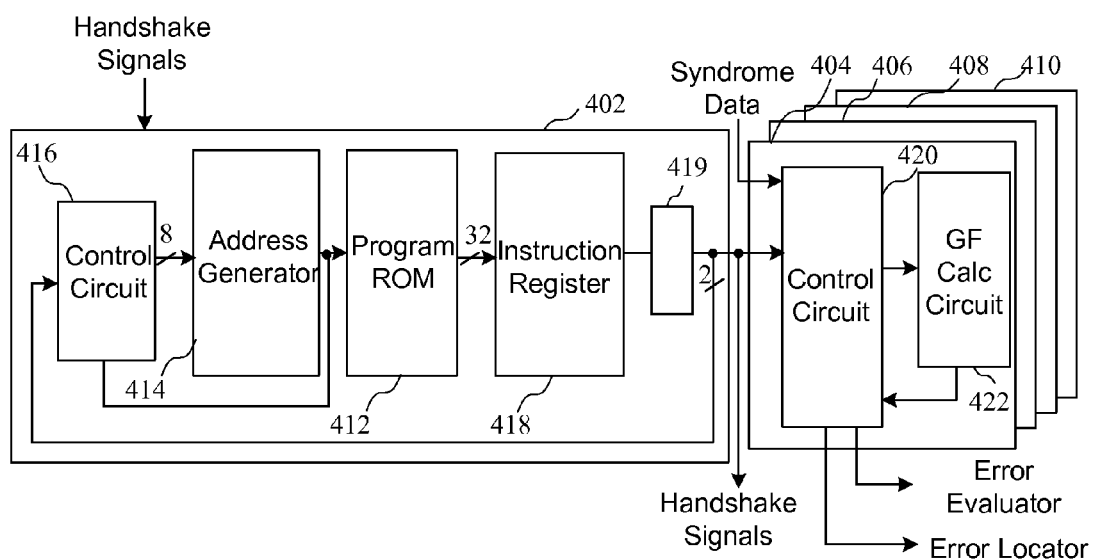
FIG. 4 is a block diagram of a decoder in a device receiving data having an error correction code according to an embodiment.

Turning now to FIG. 4, a block diagram of a decoder in a device receiving data having an error correction code is shown. An instruction generator 402 is coupled to a plurality of data processing circuits, shown in FIG. 4 as data processing circuits 404-410. The instruction generator 402 comprises a program read only memory (ROM) 412 coupled to receive an address from an address generator 414. According to the embodiment of FIG. 4, the address generator 414 may comprise a program counter. A control circuit 416 is coupled to receive an output of the Address generator 414, and a feedback output from an instruction register 418, which is coupled to the output of the program ROM 412. One or more pipeline registers 419 may be implemented after the instruction register 418. Any number of pipeline stages can be added on the ROM output, without affecting the operation of the circuit, provided that they can be reset to a known state. The instruction generator 402 both receives handshake signals from an adjacent decoder circuit (such as another decoder as shown in FIG. 4), and generates handshake signals which are provided to another adjacent decoder circuit.

The program ROM 412 is indexed by program counter, which may be an 8-bit counter, for example. The output of the program ROM 412 is fed into an instruction register 418, which may be a 32-bit wide instruction register, for example. Data is fed back from the instruction register 418 and combined with two handshaking signals from a preceding processing block in order to compute the new program counter and determine whether to enable the program ROM and any pipeline registers. Although only the details of data processing circuit 404 are shown, the data processing circuits 406-410 have at least the same elements as shown in data processing circuit 404, where each data processing circuit will receive different syndrome data. By using a microcode architecture having instructions stored in a program ROM for control, circuit speed may be increased, while size is reduced by utilizing spare BRAM resources. The ROM can also be easily shared between a group of datapath units operating together, yielding even more significant area savings.

Figure 5:
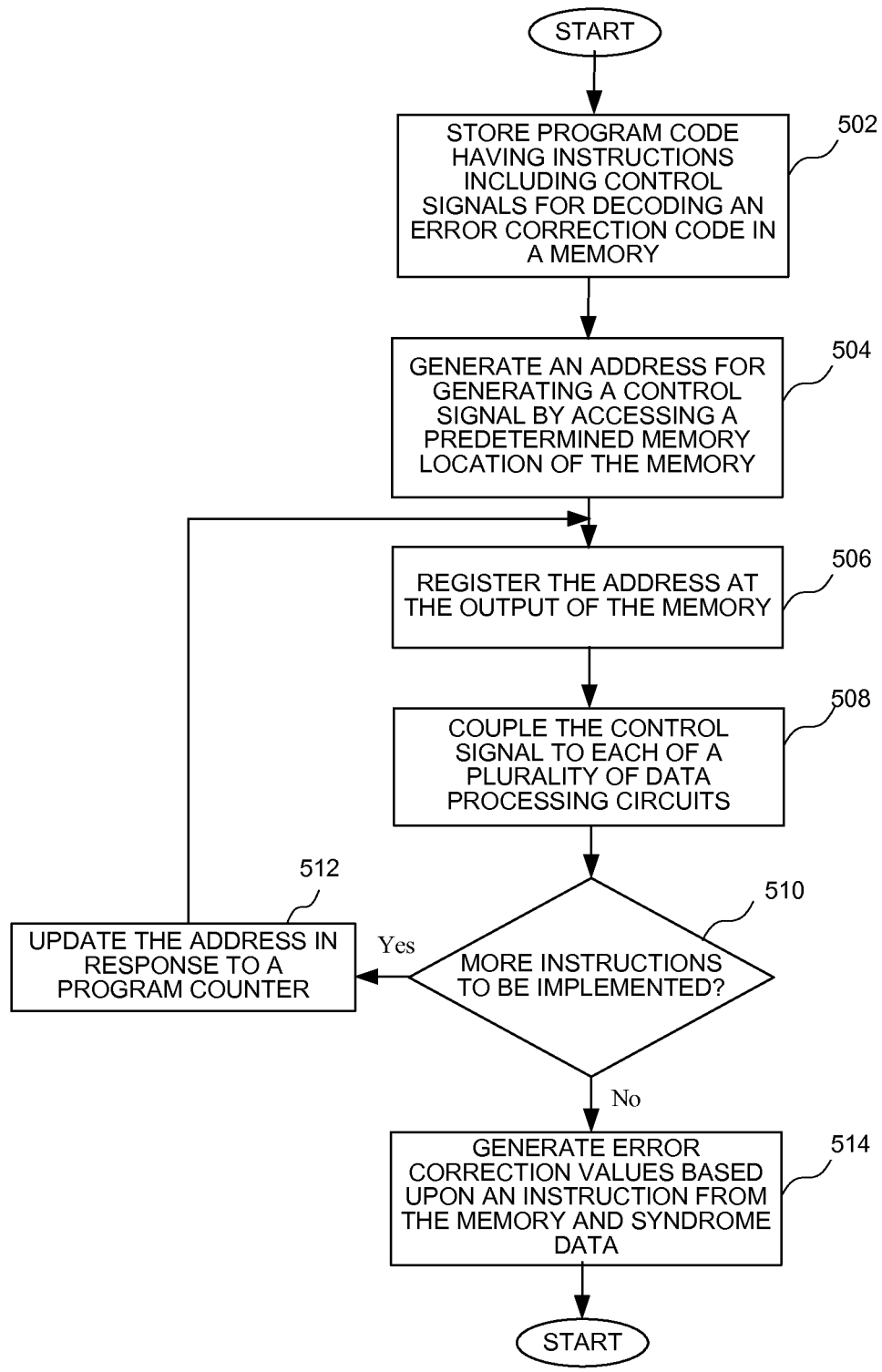
FIG. 5 is a flow chart showing a method of decoding data having an error correction code according to an embodiment.

The data processing circuit 404 has a control circuit 420 for coupled to a GF calculation circuit 422, and generates error correction values. According to one embodiment, the data processing circuit 404 could implement a Reed-Solomon decoder and generate an error evaluator signal and an error locator signal. Depending on the parameters of the Reed-Solomon code being processed by the decoder of FIG. 4, the size and shape of the program ROM 412 could be varied, the control bus to the memories of the data processing circuit 404 could be made narrower or wider than 32 bits, and the input to the program counter could be made narrower or wider than 8 bits. The instructions of the program ROM is preferably specified for a fixed set of code parameters. The instruction stream can be created when the decoder core is compiled, based on the supplied parameters. While specific reference is made to implementing a BMA circuit, a similar configuration could be applied to a key-equation solver using a different algorithm, such as the modified Euclidean algorithm, for example. Further, the program ROM 412 could be implemented in any type of decoder for decoding signals according to the various embodiments. The circuits of FIG. 4 could be implemented in the programmable resources of the circuits of FIGS. 1 and 2 for example, or other suitable circuits Turning now to FIG. 5, a flow chart shows a method of decoding data having an error correction code. The method of FIG. 5 may be implemented using the circuit of FIGS. 1-4 as described, or some other suitable circuits. In particular, program code having instructions including control signals for decoding an error correction code is stored in a memory at a step 502. The memory could be a BRAM as described in reference to FIG. 1, or a LUT-based memory of a CLE, as described in FIG. 2, for example. An address for generating a control signal is generated by accessing a predetermined memory location of a memory at a step 504. The address at the output of the memory may be stored in a register at a step 506. The control signal is coupled to each of a plurality of data processing circuits at a step 508. It is then determined whether there are more instructions to be implemented at a step 510. If so, the address is updated in response to a program counter at a step 512. If not, error correction values are generated based upon an instruction from the memory and syndrome data at a step 514. The error correction values could be values associated with a BMA decoder implemented in a Reed-Solomon decoder, for example.

It can therefore be appreciated that the new and novel decoder and method of decoding data having an error correction code has been described. It will be appreciated by those skilled in the art that numerous alternatives and equivalents will be seen to exist which incorporate the disclosed invention. As a result, the invention is not to be limited by the foregoing embodiments, but only by the following claims.

What is claimed is:

1. A decoder in a device receiving data having an error correction code, the decoder comprising:
   a memory storing program code having a plurality of instructions including control signals for decoding an error correction code;
   an address generator coupled to the memory, the address generator updating an address coupled to the memory for generating an instruction of the plurality of instructions;
   a first data processing circuit coupled to receive the instruction from the memory and further coupled to receive first syndrome data, wherein the first data processing circuit generates first error locator polynomials; and
   a second data processing circuit coupled to the memory, the second data processing circuit coupled to receive the instruction and further coupled to receive second syndrome data, wherein the second data processing circuit generates second error locator polynomials;
   wherein the memory is shared with the first data processing circuit and the second data processing circuit, and a control signal of the instruction is provided to the first data processing circuit and the second data processing circuit in response to the address generator updating the address coupled to the memory for generating the instruction.

2. The decoder of claim 1, further comprising an instruction register coupled to the memory, the instruction register storing an output of the memory.

3. The decoder of claim 1, where the address generator comprises a program counter.

4. The decoder of claim 1, wherein the first data processing circuit generates an error evaluator signal.

5. The decoder of claim 4, wherein the first data processing circuit generates an error locator signal.

6. A decoder in a device receiving data having an error correction code, the decoder comprising:
   a memory storing program code having a plurality of instructions including a control signal for decoding an error correction code;
   a program counter coupled to the memory, the program counter updating an address coupled to the memory for generating an instruction of the plurality of instructions;
   a first data processing circuit coupled to receive the instruction from the memory and further coupled to receive first syndrome data, the first data processing circuit generating first error locator polynomials; and
   a second data processing circuit coupled to receive the instruction from the memory and further coupled to receive second syndrome data, the second data processing circuit generating second error locator polynomials;
   wherein the memory is shared with the first data processing circuit and the second data processing circuit, and a control signal of the instruction is provided to the first data processing circuit and the second data processing circuit in response to the program counter updating the address for generating the instruction.

7. The decoder of claim 6, further comprising an instruction register coupled to the output of the memory.

8. The decoder of claim 7, further comprising one or more pipelining stages coupled to the output of the instruction register.

9. The decoder of claim 6, wherein:
   the first data processing circuit generates a first error evaluator signal associated with the first syndrome data; and
   the second data processing circuit generates a second error evaluator signal associated with the second syndrome data.

10. The decoder of claim 6, wherein each of the first and second data processing circuits enables erasure decoding to designate known errors for input symbols.

11. The decoder of claim 6, wherein each of the first and second data processing circuits comprises a Reed-Solomon decoder.

12. A method of decoding data having an error correction code, the method comprising:
   storing, in a memory, program code having instructions including control signals for decoding an error correction code, when the memory is shared by a first data processing circuit and a second data processing circuit;
   coupling an address to the memory;
   generating an instruction of the program code by accessing a predetermined memory location of the memory based upon the address;
   providing a control signal of the instruction for decoding an error correction code to the first data processing circuit and the second data processing circuit;
   generating first error locator polynomials in the first data processing circuit based upon the instruction from the memory and further based upon first syndrome data; and
   generating second error locator polynomials in the second data processing circuit based upon the instruction from the memory and further based upon second syndrome data.

13. The method of claim 12, wherein generating an instruction by accessing a predetermined memory location of the memory based upon the address comprises incrementing an address for the instruction using a program counter.

14. The method of claim 13, wherein storing, in a memory, program code having instructions including control signals for decoding an error correction code comprises downloading a configuration bitstream to an integrated circuit device having programmable resources.

15. The method of claim 12, further comprising coupling the control signals of the instruction to each of a plurality of data processing circuits.

16. The method of claim 12, further comprising generating an error evaluator signal.

17. The method of claim 12, further comprising generating an error locator signal.

* * * * *